(12) United States Patent
Wang et al.

(10) Patent No.: US 8,895,404 B2
(45) Date of Patent: Nov. 25, 2014

(54) METHOD OF BACK-SIDE PATTERNING

(71) Applicant: Shanghai Hua Hong Nec Electronics Co., Ltd., Shanghai (CN)

(72) Inventors: Lei Wang, Shanghai (CN); Xiaobo Guo, Shanghai (CN)

(73) Assignee: Shanghai Hua Hong Nec Electronics Co. Ltd., Shanghai (CN)

( * ) Notice: Subject to any disclaimer, the term of this patent is extended or adjusted under 35 U.S.C. 154(b) by 0 days.

(21) Appl. No.: 13/966,847

(22) Filed: Aug. 14, 2013

(65) Prior Publication Data
US 2014/0051224 A1    Feb. 20, 2014

(30) Foreign Application Priority Data

Aug. 14, 2012 (CN) .......................... 2012 1 0289292

(51) Int. Cl.
*H01L 21/76* (2006.01)
*H01L 21/683* (2006.01)
*H01L 23/544* (2006.01)
*H01L 21/66* (2006.01)
*H01L 27/06* (2006.01)

(52) U.S. Cl.
CPC ....... *H01L 22/30* (2013.01); *H01L 2221/68327* (2013.01); *H01L 2223/54453* (2013.01); *H01L 2221/68381* (2013.01); *H01L 2223/54426* (2013.01); *H01L 27/0694* (2013.01); *H01L 21/6835* (2013.01); *H01L 2221/6834* (2013.01); *H01L 23/544* (2013.01)

USPC .......................................... 438/401; 438/464

(58) Field of Classification Search
CPC ........................................... H01L 23/544
USPC .................................................. 438/401, 464
See application file for complete search history.

(56) References Cited

U.S. PATENT DOCUMENTS

| | | | | |
|---|---|---|---|---|
| 5,292,686 A | * | 3/1994 | Riley et al. | 438/605 |
| 6,768,539 B2 | * | 7/2004 | Gui et al. | 355/53 |
| 6,861,186 B1 | * | 3/2005 | Pagette et al. | 430/22 |
| 7,113,258 B2 | * | 9/2006 | Van Buel et al. | 355/53 |
| 7,588,993 B2 | * | 9/2009 | Liu et al. | 438/401 |
| 7,859,033 B2 | * | 12/2010 | Brady | 257/294 |
| 7,923,344 B2 | * | 4/2011 | Fu et al. | 438/401 |
| 2007/0231963 A1 | * | 10/2007 | Doan et al. | 438/107 |
| 2010/0109060 A1 | * | 5/2010 | Mao et al. | 257/292 |

* cited by examiner

*Primary Examiner* — Nicholas Tobergte
(74) *Attorney, Agent, or Firm* — MKG, LLC

(57) ABSTRACT

A method of back-side patterning of a silicon wafer is disclosed, which includes: depositing a protective layer on a front side of a silicon wafer; forming one or more deep trenches through the protective layer and extending into the silicon wafer by a depth greater than a target thickness of the silicon wafer; flipping over the silicon wafer and bonding the front side of the silicon wafer with a carrier wafer; polishing a back side of the silicon wafer; performing alignment by using the one or more deep trench alignment marks and performing back-side patterning process on the back side of the silicon wafer; and de-bonding the silicon wafer with the carrier wafer.

11 Claims, 6 Drawing Sheets

METHOD OF BACK-SIDE PATTERNING

CROSS-REFERENCES TO RELATED APPLICATIONS

This application claims the priority of Chinese patent application number 201210289292.6, filed on Aug. 14, 2012, the entire contents of which are incorporated herein by reference.

TECHNICAL FIELD

The present invention relates to the fabrication of integrated circuits, and more particularly, to a method of back-side patterning of a silicon wafer.

BACKGROUND

In the fabrication of some power devices such as reverse-conductor insulated-gate bipolar transistors (RC-IGBTs), device structures are formed on both the front and back sides of a silicon wafer, which requires the process of double-sided patterning as well as alignment between patterns on the front and back sides of the silicon wafer.

The general practice for achieving the above device structures is one called back-side alignment, for which special lithographic apparatuses and processes are employed. Specifically, in a back-side alignment process, alignment marks are formed on the front side of a wafer, and are taken as alignment references during the back-side lithographic processes. As the silicon wafer is turned upside down when performing back-side alignment, i.e., its front side is facing downwards, a special method is needed to achieve the alignment. According to different light sources adopted, commonly used alignment methods are classified into those adopting infrared light and visible light. Moreover, according to different detecting modes, commonly used detecting methods are classified into reflection detecting and transmission detecting. Currently, all alignment methods adopted in practice are a combination of the above categories.

When infrared light is used, determined by its physical properties, both its reflectivity and transmissivity are affected by characteristics of the wafer and the process, for example, the wafer thickness, doping type and doping concentration of the wafer, and whether the pattern on the front side of the wafer is formed of metal. These will have great impacts on the intensity and signal to noise ratio (SNR) of infrared signals. Therefore, for a determined alignment mode, the process must be carried out in fixed steps, i.e., in which step the back-side lithography should be performed is strictly limited. Meanwhile, extremely high requirements are also imposed on the dopant type and concentration, which will severely limit the properties of the device. Therefore, the existing alignment method with infrared light and the subsequent back-side patterning process all should be designed according to the requirements of the alignment method, which will severely limit the choice of devices and process conditions of the back-side patterning process. Moreover, the existing alignment method needs extra devices and process conditions for back-side patterning process and thus leads to a high manufacturing cost. As a result, different apparatuses must be employed to produce specific devices with different properties, thus leading to a high production cost of the devices.

On the other hand, when visible light is used, as it cannot pass through a silicon wafer, one can only adopt the reflection type alignment. In such a mode, when performing the back-side lithographic process, the silicon wafer held by a wafer stage must be placed with the back side facing upwards, namely, with the front side where the alignment marks are formed facing downwards and contacting with the wafer stage, and thus holes must be drilled in the wafer stage in order to introduce light into the holes from the back side of the wafer. In order to avoid harming the wafer stage's function of holding the silicon wafer by suction, positions and sizes of such holes are limited, thus increasing the complexity of circuit layout design. Further, there are also strict requirements on a protective film that is coated on the front side of the wafer to protect the pattern formed thereon before the wafer is flipped over. For example, in order for visible light to pass through, such film must be transparent and have uniform and stable optical properties.

Overall, because all these methods require expensive special apparatuses and a corresponding specific process, the fabrication cost of this kind of devices has remained high. Not limited to the above, other back-side processes such as back-side implantation and back-side metallization also require special apparatuses. Therefore, manufacturers have tried to avoid the use of such back-side processes if alternative solutions are available.

In addition, the breakdown voltage of certain types of devices is closely dependent on the thickness of the silicon wafer. Specifically, given the facts that the ratio of breakdown voltage to thickness for silicon is about 10V/μm, and that common consumer-level electronic products have an operating voltage range of 110 volts alternating current (VAC) to 380 VAC and a typical breakdown voltage of about 600 V, silicon substrates for silicon-based integrated devices are generally required to have a thickness of smaller than 100 μm, and typically, from 50 μm to 60 μm. Commonly employed silicon wafer fabrication processes cannot achieve a thickness smaller than 60 μm and must be aided by using carrier substrates, which are thin films commonly made of organic materials, glasses, silicon, metals and the like. Use of such carrier substrates greatly limits subsequent processes. For example, as carrier substrates made of organic materials or glasses cannot be sucked by electrostatic adsorption, when adopting such carrier substrates, all electrostatic adsorption apparatuses throughout the whole production line must be substituted with special suction apparatuses. Moreover, as metals and silicon are opaque materials, no back-side process is applicable when a carrier substrate formed of metal or silicon is applied. Therefore, there is no effective double-sided patterning method suitable for mass production of thin silicon wafers (i.e., those with a thickness of smaller than 150 μm) at present.

Taiko polishing process is one of the polishing processes for thin silicon wafers. It has a characteristic of only polishing a central portion of the silicon wafer and remaining an edge portion (about 3 mm to 5 mm wide) of the silicon wafer unpolished, such that a support ring, which has a thickness greater than that of the central portion of the silicon wafer, is formed at the edge of the silicon wafer. Thus, deformation or break of the thin silicon wafer will not occur in the subsequent transmission, manufacturing and transportation processes.

SUMMARY OF THE INVENTION

The present invention addresses the above issues encountered in the prior art by presenting a method of back-side patterning on silicon wafer. The method is able to greatly reduce the production cost by achieving the alignment of front-side patterns with back-side patterns without using any special back-side lithography processes or apparatuses, that is, all the apparatuses used in the back-side patterning process are compatible with those apparatuses used in the front-side patterning process. Therefore, the method can greatly reduce the production cost and is compatible with existing thin-wafer processes.

To achieve the above objectives, the method of back-side patterning provided by the present invention includes the steps of:

depositing a protective layer on a front side of a silicon wafer;

forming, on the front side of the silicon wafer, one or more deep trenches to serve as one or more deep trench alignment marks for back-side patterning, the one or more deep trenches being formed through the protective layer and extending into the silicon wafer, each of the one or more deep trenches extending into the silicon wafer by a depth greater than a target thickness of the silicon wafer;

flipping over the silicon wafer and bonding the front side of the silicon wafer with a carrier wafer;

polishing a back side of the silicon wafer until a thickness of at least a central portion of the silicon wafer is reduced to the target thickness and the one or more deep trench alignment marks are exposed from the back side of the silicon wafer;

performing alignment by using the one or more deep trench alignment marks and performing back-side patterning process on the back side of the silicon wafer; and de-bonding the silicon wafer with the carrier wafer.

Preferably, the method further includes performing front-side patterning process on the front side of the silicon wafer before depositing the protective layer on the front side of the silicon wafer.

Preferably, the front-side patterning process includes a front-side forming process and a front-side interconnecting process.

Preferably, at least part of the back-side patterning process is performed by using same devices and process conditions with the front-side patterning process.

Preferably, the carrier wafer is made of glass, ceramic or sapphire.

Preferably, polishing the back side of the silicon wafer is performed by using Taiko polishing process, such that a thickness of the central portion of the silicon wafer is reduced to the target thickness and a support ring having a thickness greater than the thickness of the central portion of the silicon wafer is formed at an edge portion of the silicon wafer.

Preferably, the method further includes removing the support ring after de-bonding the silicon wafer with the carrier wafer.

Preferably, the protective layer has a thickness of 3000 Å to 50 μm.

Preferably, the protective layer has a thickness of 1 μm to 10 μm.

Preferably, the protective layer is selected from a multilayer of silicon dioxide, silicon nitride, silicon oxynitride, silicon dioxide and silicon nitride, a multilayer of silicon dioxide, silicon nitride and silicon oxynitride, or a compound of silicon, oxygen, carbon and nitrogen.

Optionally, the one or more deep trenches are not filled with any material.

Optionally, the method further includes filling the one or more deep trenches with a dielectric material after forming the one or more deep trenches.

Preferably, the dielectric material is a non-metallic inorganic compound composed of silicon, oxygen, nitrogen and carbon.

Preferably, the dielectric material is selected from silicon nitride, silicon oxynitride or silicon dioxide.

Optionally, the method further includes filling the one or more deep trenches with a metal material after forming the one or more deep trenches.

Preferably, the metal material is selected from aluminum, copper or tungsten.

Preferably, de-bonding the silicon wafer with the carrier wafer is performed by using laser irradiation, chemical dissolution or thermal decomposition.

Preferably, the method further includes removing the protective layer after de-bonding the silicon wafer with the carrier wafer.

In the present invention, after the front-side patterning process is completed, one or more deep trenches are formed through a main body of the silicon wafer to define alignment marks for back-side patterning, and then back-side polishing process is performed to expose the deep trench alignment marks in the back side of the silicon wafer, enabling the alignment marks to present on the same surface of the silicon surface with the back-side patterns to be formed. Thus, during the back-side patterning process, there is no need to introduce special lithography apparatuses or processes, such as the apparatus and process for simultaneously measuring the front-side and back-side patterns to achieve alignment, which are required in the prior art when the alignment marks and the back-side patterns are formed on different sides of the silicon wafer. In the present invention, the method can be realized by using the same apparatuses and process conditions with existing front-side patterning processes, and therefore may greatly reduce the production cost and is compatible with existing thin-wafer processes.

Moreover, the deep trench alignment marks of the present invention may also be used as reference marks by some other devices for adjusting the position of the silicon wafer.

Furthermore, the temporarily bonded silicon wafer may be treated in the same way as normal silicon wafers (i.e. thicker silicon wafers) in lithography, etching, filming, cleaning and measuring processes without using special apparatuses required in the prior art.

BRIEF DESCRIPTION OF THE DRAWINGS

The present invention will be described and specified below with reference to accompanying drawings and exemplary embodiments.

DETAILED DESCRIPTION

Figure 1:
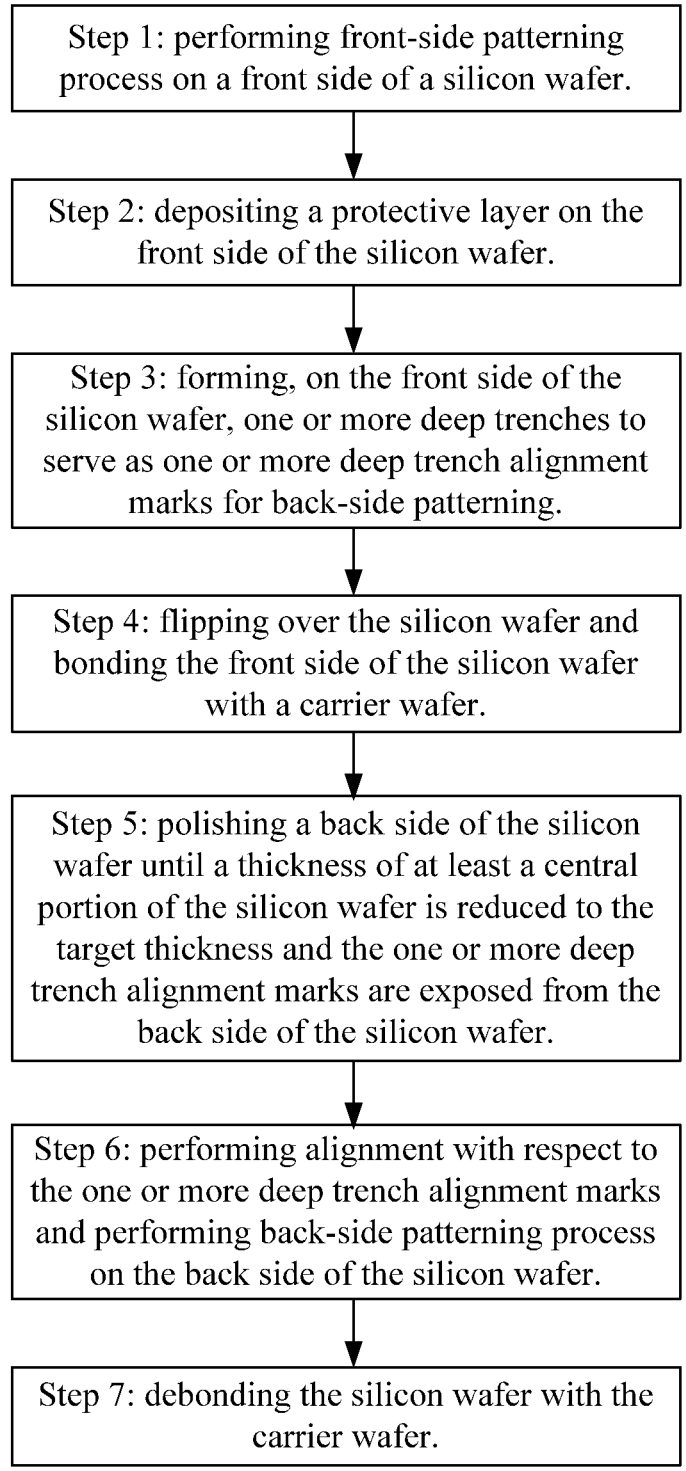
FIG. 1 shows a flowchart of a method in accordance with embodiment 1 of the present invention.
Figure 2A:
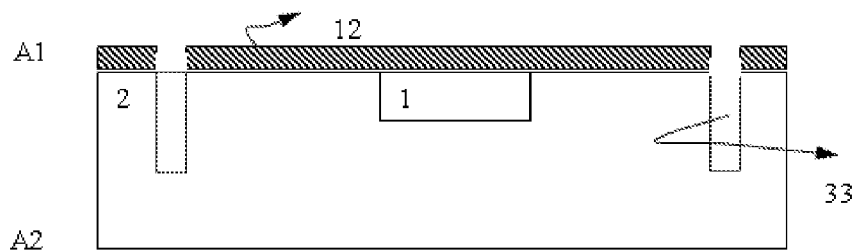
FIGS. 2a to 2h show schematic illustrations after steps of a method in accordance with embodiment 1 of the present invention.

The present invention will be specifically described below by taking the formation of a reverse-conductor insulated-gate bipolar transistor (RC-IGBT) as an example, wherein the RC-IGBT has a rated breakdown voltage of about 1200 V and a target thickness of 80 μm to 100 μm for the wafer 2; an IGBT device is formed on its front side, and alternatively arranged P-type and N-type regions are formed on its back side (i.e., beneath the IGBT pattern). The device of the present invention is fabricated in the following steps:

Step 1: As shown in FIG. 2a, first provide a silicon wafer 2 with an initial thickness of 725 μm; then a front-side patterning process is performed on the front side of the silicon wafer 2 to form a front-side pattern 1, wherein the front-side patterning process comprises a front-side forming process and a front-side interconnecting process. As shown in the figure, the front side of the silicon wafer 2 is indicated by A1 and a back side of the silicon wafer 2 is indicated by A2. The front side structure of the device of this embodiment is an IGBT device.

Step 2: Further referring to FIG. 2a, deposit a protective layer 12 on the front side of the silicon wafer 2 which has gone through the front-side patterning process. The protective layer 12 may have a thickness of 3000 Å to 50 μm. In this embodiment, the protective layer 12 has a thickness of 0.8 μm to 7 μm. The protective layer 12 may be formed of a multilayer of $SiO_2$ (silicon dioxide), SiN (silicon nitride), SiON (silicon oxynitride), silicon dioxide and silicon nitride, a multilayer of silicon dioxide, silicon nitride and silicon oxynitride, or a compound of Si (silicon), O (oxygen), C (carbon) and N (nitrogen); silicon dioxide is used in this embodiment.

Step 3: As shown in FIG. 2a, form deep trenches 33 on the front side of the silicon wafer 2 by using lithography and etching process after forming the protective layer 12. The deep trenches 33 are formed through the protective layer 12 and extend into the silicon wafer 2. Each of the deep trenches 33 extends into the silicon wafer by a depth greater than a target thickness of the silicon wafer 2 which is equal to a thickness of the front side structure plus a thickness of the back side structure to be formed. The target thickness of the silicon wafer 2 has a close relationship with the breakdown voltage of the device, which relationship can be described as about 10V/μm. In this embodiment, the target thickness of the silicon wafer 2 is 80 μm to 100 μm and the depth of the deep trenches 33 is 100 μm to 150 μm.

The region of the deep trenches 33 should avoid the region of the front side pattern 1. The deep trenches 33 will serve as deep trench alignment marks for back-side patterning.

Figure 2B:
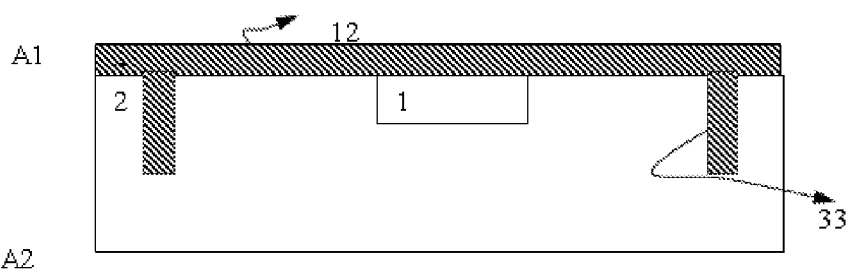

As shown in FIG. 2b, the deep trenches 33 may be filled with a dielectric material after forming the deep trenches 33, and the deep trenches 33 filled with the dielectric material are used as deep trench alignment marks in subsequent processes. The dielectric material may be a non-metallic inorganic compound composed of silicon, oxygen, nitrogen and carbon. Preferably, the dielectric material is selected from silicon nitride, silicon oxynitride or silicon dioxide; silicon dioxide is used in this embodiment. Next, planarize the surface of the silicon wafer 2 after filling the deep trenches 33 with the dielectric material. A thickness of the protective layer 12 should be greater than 0.3 μm after the planarization.

In another embodiment, the deep trenches 33 are not filled with any material, and the hollow deep trenches 33 are used as deep trench alignment marks.

In another embodiment, the deep trenches 33 may be filled with a metal material after forming the deep trenches 33, and the deep trenches 33 filled with the metal material are used as deep trench alignment marks. The metal material may be selected from Al (aluminum), Cu (copper) or W (tungsten).

Figure 2C:
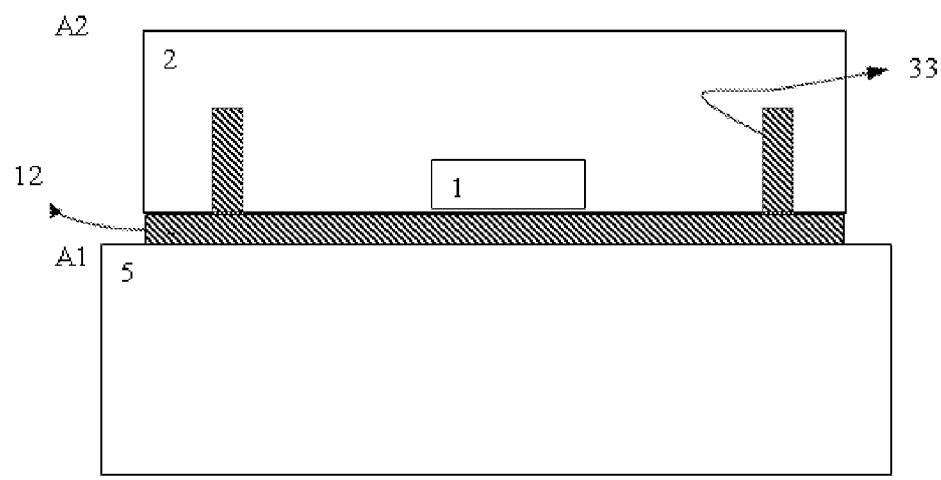

Step 4: As shown in FIG. 2c, flip over the silicon wafer 2 and bond its front side A1 with a carrier wafer 5 to make the back side A2 of the device wafer 2 turn upward, the carrier wafer 5 may be made of glass, ceramic or sapphire.

Herein, thermal bonding/de-bonding is used as an example. The adhesive used in the bonding process has a thickness of 20 μm to 50 μm and is heated at a temperature of 65° C. to 300° C. for 3 minutes to 10 minutes during the de-bonding process. Other de-bonding process such as laser irradiation or chemical dissolution may also be used.

Figure 2D:
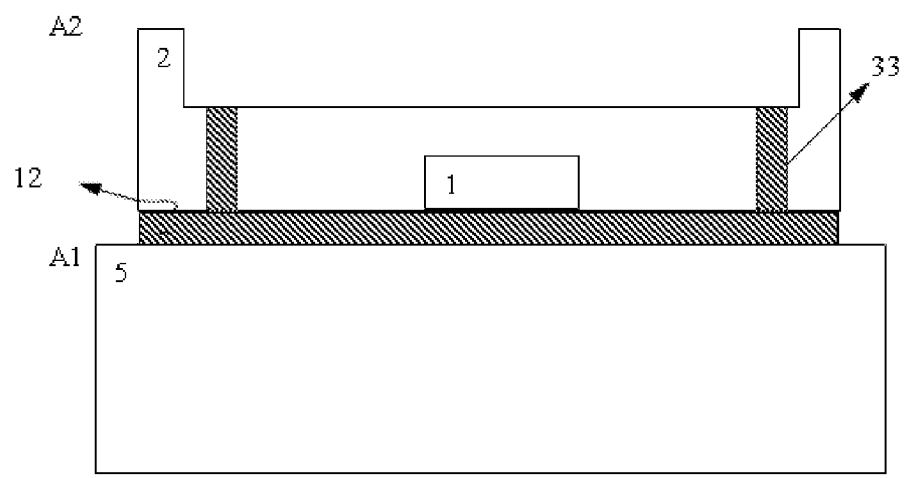

Step 5: As shown in FIG. 2d, polish the back side of the silicon wafer 2 until the thickness of a main body of the silicon wafer 2 is reduced to a target thickness of 80 μm to 100 μm.

The polishing process may be a Taiko polishing process, which only polishes the central portion of the silicon wafer 2 and remains the edge portion of the silicon wafer 2 unpolished.

A pre-polishing process is performed to reduce the thickness of the silicon wafer 2 to 400 μm to 500 μm before the Taiko polishing process. Then perform the Taiko polishing process, after which, a support ring having a thickness greater than the thickness of the central portion of the silicon wafer 2 is formed at an edge portion of the silicon wafer 2. In this embodiment, the thickness of the central portion of the silicon wafer 2 after Taiko polishing is equal to the target thickness of the silicon wafer 2, i.e. 80 μm to 100 μm, and the width of the support ring is 3 mm to 4 mm.

Since the alignment marks defined by the deep trenches 33 have a depth greater than the target thickness of the silicon wafer 2, the alignment marks are exposed from the polished back side surface of the silicon wafer 2 after this step. In one embodiment, the silicon dioxide filled in the deep trenches 33 functions as a polishing stop layer to protect the alignment marks from being polished away. As the deep trench alignment marks are formed through the silicon wafer 2, the front side and the back side of the silicon wafer share the same alignment marks, and thus ensures the alignment of front-side and back-side patterns.

Optionally, perform a hydrofluoric (HF) acid liquid based wet etching process to the silicon dioxide filled in the deep trenches 33 to make the level of the surface of the silicon dioxide more than 500 Å lower than the level of the surface of the surrounding silicon wafer 2, in order to strengthen the effect of the alignment marks.

Figure 2E:
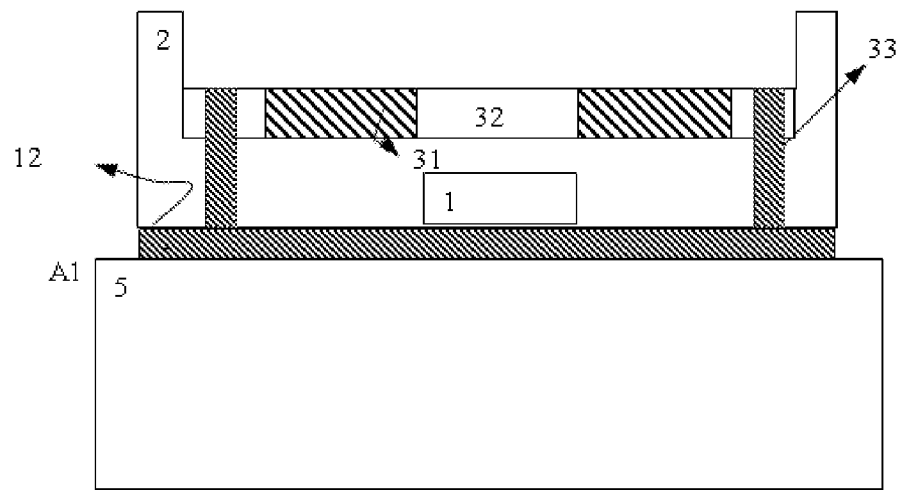

Step 6: As shown in FIG. 2e, perform alignment by using the deep trench alignment marks and perform a back-side patterning process on the back side of the silicon wafer 2 to form back-side patterns 31 and 32. The back-side patterning process includes a back-side forming process, wherein the back side and front side structures of the silicon wafer 2 are aligned with each other by using the alignment marks and constitute a complete device. In this embodiment, the back side structure includes P-type and N-type implantation regions; the back-side forming process includes the corresponding lithography patterning and implantation processes of the P-type and N-type implantation regions.

The process conditions of the back-side patterning process may be compatible with the process conditions of the corresponding part of a front-side patterning process of some other devices, so that these two processes can be performed using the same device and process conditions. For example, the lithography patterning of the P-type and N-type implantation regions and the corresponding implantation processes may use the same lithographic and ion implantation apparatuses and process conditions with other devices that involve the formation of the P-type and N-type implantation regions therein.

Figure 2F:
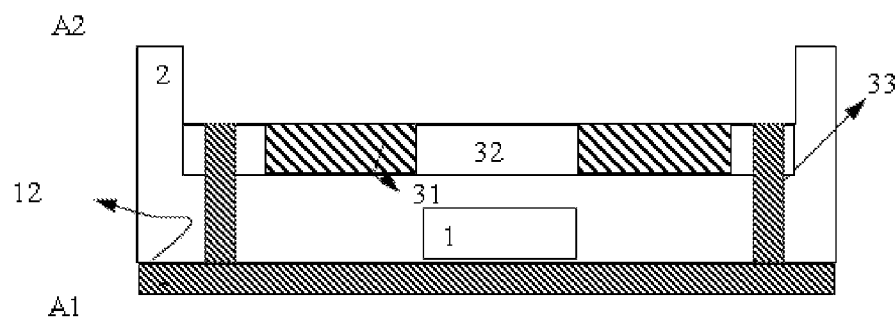

Step 7: As shown in FIG. 2f, perform a de-bonding process after the back-side patterning process is completed to de-bond the silicon wafer 2 (with a complete device formed thereon) with the carrier wafer 5. In this embodiment, the de-bonding process uses the thermal de-bonding process at a temperature of 65° C. to 300° C. for 3 minutes to 10 minutes. The de-bonding process may use laser irradiation or chemical dissolution when using other adhesives.

Figure 2G:
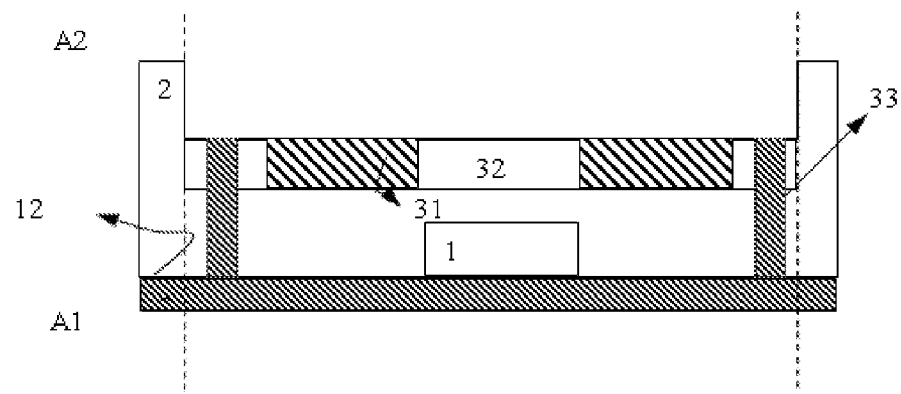

As shown in FIG. 2g, remove the support ring after de-bonding the silicon wafer 2 with the carrier wafer 5.

Figure 2H:
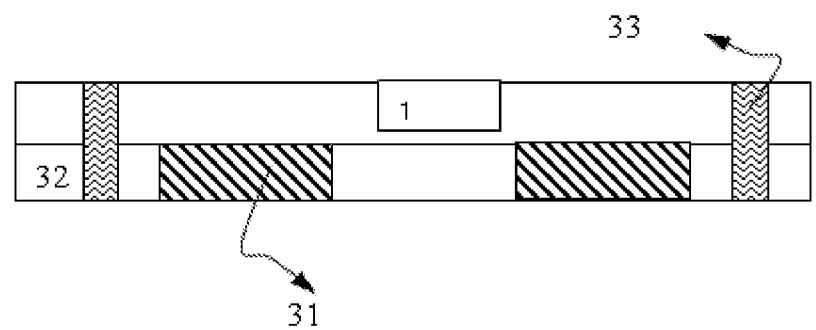

As shown in FIG. 2h, remove the protective layer 12.

Figure 3A:
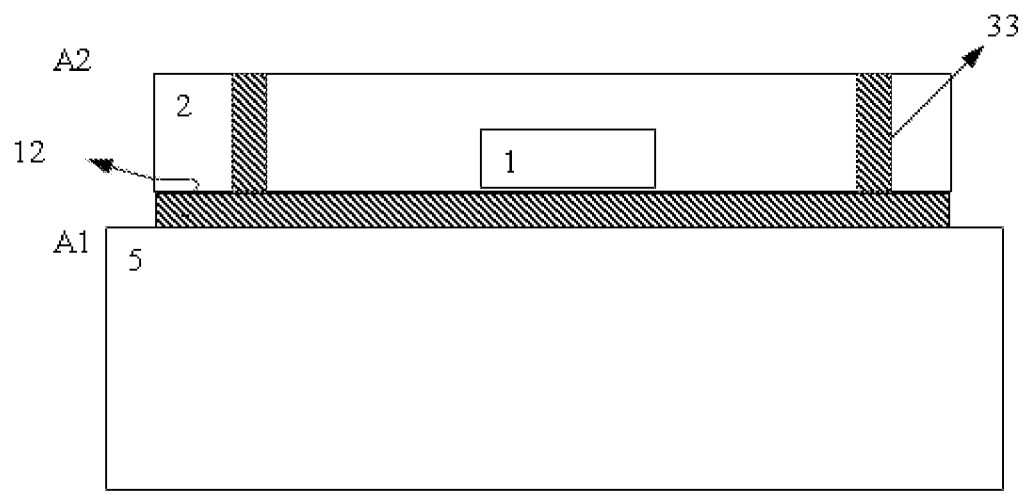
FIGS. 3a to 3c show schematic illustrations after steps of a method in accordance with embodiment 2 of the present invention.
Figure 3B:
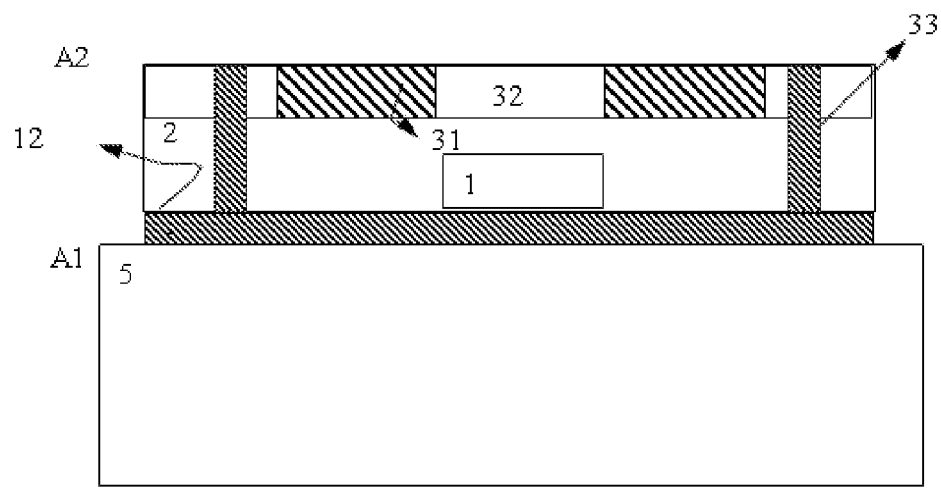
Figure 3C:
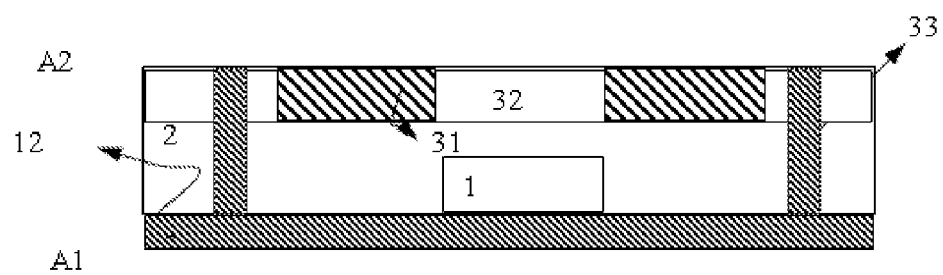

FIGS. 3a-3c show schematic illustrations after steps of a method in accordance with embodiment 2 of the present invention. The steps 1-4 of embodiment 2 are the same with the steps 1-4 of embodiment 1 of the present invention.

As shown in FIG. 3a, the difference between step 5 of embodiment 2 and step 5 of embodiment 1 is that the polishing process, performed on the back side of the silicon wafer 2, is a global polishing process instead of the Taiko polishing process, and is performed until the thickness of the main body of the silicon wafer 2 is equal with the target thickness of the silicon wafer 2, i.e. a thickness of 80 μm to 100 μm. And as shown in FIG. 3a, the support ring is not formed around the silicon wafer 2 after the polishing process in step 5.

As shown in FIG. 3b, the step 6 of embodiment 2 is the same with the step 6 of embodiment 1 of the present invention.

As shown in FIG. 2f, the difference between step 7 of embodiment 2 and step 7 of embodiment 1 is that the step of removing the support ring after the de-bonding process is not included in step 7 of embodiment 2.

The present invention is not limited to the embodiments described above, and foregoing description on the specific embodiments is only for describing and specifying the technical scheme of the invention. It will be understood that obviously modifications and variations in light of the above teachings will fall within the scope of the invention. The foregoing specific embodiments are provided to show the best way to carry out the present invention so that one of ordinary skill in the art may use the specific embodiment disclosed, as well as their equivalent constructions, as a basis for achieving the same purposes of the present invention.

What is claimed is:

1. A method of back-side patterning, comprising the following steps in the sequence set forth:
    depositing a protective layer on a front side of a silicon wafer;
    forming, on the front side of the silicon wafer, one or more deep trenches to serve as one or more deep trench alignment marks for back-side patterning, the one or more deep trenches being formed through the protective layer and extending into the silicon wafer, each of the one or more deep trenches extending into the silicon wafer by a depth greater than a target thickness of the silicon wafer and being not filled with any material so that the one or more deep trench alignment marks remain hollow;
    flipping over the silicon wafer and bonding the front side of the silicon wafer with a carrier wafer;
    polishing a back side of the silicon wafer by using Taiko polishing process until a thickness of a central portion of the silicon wafer is reduced to the target thickness and the one or more hollow deep trench alignment marks are exposed from the back side of the silicon wafer, such that a support ring having a thickness greater than the thickness of the central portion of the silicon wafer is formed at an edge portion of the silicon wafer;
    performing alignment by using the one or more hollow deep trench alignment marks and performing back-side patterning process on the back side of the silicon wafer;
    de-bonding the silicon wafer with the carrier wafer; and
    removing the support ring.

2. The method according to claim 1, further comprising performing front-side patterning process on the front side of the silicon wafer before depositing a protective layer on the front side of the silicon wafer.

3. The method according to claim 2, wherein the front-side patterning process comprises a front-side forming process and a front-side interconnecting process.

4. The method according to claim 2, wherein at least part of the back-side patterning process is performed by using same devices and process conditions with the front-side patterning process.

5. The method according to claim 1, wherein the carrier wafer is made of glass, ceramic or sapphire.

6. The method according to claim 1, wherein the protective layer has a thickness of 3000 Å to 50 μm.

7. The method according to claim 6, wherein the protective layer has a thickness of 1 μm to 10 μm.

8. The method according to claim 1, wherein the protective layer is selected from a multilayer of silicon dioxide, silicon nitride, silicon oxynitride, silicon dioxide and silicon nitride, a multilayer of silicon dioxide, silicon nitride and silicon oxynitride, or a compound of silicon, oxygen, carbon and nitrogen.

9. The method according to claim 1, wherein de-bonding the silicon wafer with the carrier wafer is performed by using laser irradiation, chemical dissolution or thermal decomposition.

10. The method according to claim 1, further comprises removing the protective layer after de-bonding the silicon wafer with the carrier wafer.

11. A method of back-side patterning, comprises the following steps in the sequence set forth:
    depositing a protective layer on a front side of a silicon wafer;
    forming, on the front side of the silicone wafer, one or more deep trenches to serve as one or more deep trench alignment marks for back-side patterning, the one or more deep trenches being formed through the protective layer and extending into the silicone wafer, each of the one or more deep trenches extending into the silicon wafer by a depth greater than a target thickness of the silicon wafer;
    filling the one or more deep trenches with silicon dioxide;
    flipping over the silicon wafer and bonding the front side of the silicon wafer with a carrier wafer;
    polishing a back side of the silicon wafer by using Taiko polishing process until a thickness of a central portion of the silicon wafer is reduced to the target thickness and the one or more deep trench alignment marks are exposed from the back side of the silicon wafer, such that a support ring having a thickness greater than the thickness of the central portion of the silicon wafer is formed at an edge portion of the silicon wafer;
    performing a hydrofluoric acid liquid based wet etching process to the silicon dioxide filled in the one or more deep trenches to make a level of a surface of the silicon dioxide more than 500 Å lower than a level of surface of the central portion of the silicon wafer;
    performing alignment by using the one or more deep trench alignment marks and performing back-side patterning process on the back side of the silicon wafer;
    de-bonding the silicon wafer with the carrier wafer; and
    removing the support ring.

* * * * *